US011061452B2

(12) United States Patent
Brunn et al.

(10) Patent No.: US 11,061,452 B2
(45) Date of Patent: Jul. 13, 2021

(54) INTEGRATED CIRCUIT WITH ENHANCED OPERATION OVER OPERATING RANGES UTILIZING A PROCESS SIGNAL TO FINE TUNE A VOLTAGE BOOSTING OPERATION

(71) Applicant: Silicon Laboratories Inc., Austin, TX (US)

(72) Inventors: Brian Taylor Brunn, Austin, TX (US); Rui Deng, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 49 days.

(21) Appl. No.: 16/570,581

(22) Filed: Sep. 13, 2019

(65) Prior Publication Data

US 2021/0081010 A1    Mar. 18, 2021

(51) Int. Cl.
*G06F 1/3203* (2019.01)
*G06F 1/20* (2006.01)
*G06F 1/3206* (2019.01)

(52) U.S. Cl.
CPC ............ *G06F 1/206* (2013.01); *G06F 1/3206* (2013.01)

(58) Field of Classification Search
CPC .................................................. G06F 1/3203
USPC ........................................................ 713/320
See application file for complete search history.

(56) References Cited

U.S. PATENT DOCUMENTS

| | | | |
|---|---|---|---|
| 6,297,624 B1* | 10/2001 | Mitsui | G05F 1/465 323/314 |
| 7,603,249 B1 | 10/2009 | Walker | |
| 2003/0011351 A1* | 1/2003 | Shim | G05F 3/245 323/316 |
| 2008/0117702 A1* | 5/2008 | Henry | G11C 7/22 365/206 |
| 2011/0080207 A1* | 4/2011 | Ball | H01L 23/34 327/512 |

(Continued)

FOREIGN PATENT DOCUMENTS

JP        09282876 A   * 10/1997

OTHER PUBLICATIONS

Yongpan Liu, Robert P. Dick, Li Shang, Huazhong Yang; "Accurate Temperature-Dependent Integrated Circuit Leakage Power Estimation is Easy"; white paper; Design, Automation and Test in Europe Conference and Exhibition—DATE 2007; Apr. 16-20, 2007; Nice, France; 6 pages.

*Primary Examiner* — Suresh Suryawanshi
(74) *Attorney, Agent, or Firm* — Polansky & Associates, P.L.L.C.; Paul J. Polansky

(57) ABSTRACT

An integrated circuit includes a digital circuit and an energy management circuit. The digital circuit operates with an internal power supply voltage in synchronism with a clock signal and comprises complementary metal-oxide-semiconductor (CMOS) transistors. The energy management circuit has an input for receiving an external power supply voltage and an output for providing the internal power supply voltage. The energy management circuit is thermally coupled to the digital circuit and sets the internal power supply voltage to a nominal voltage when a temperature of the digital circuit is greater than a boost temperature. The energy management circuit boosts the internal power supply voltage to a boosted voltage greater than the nominal voltage when the temperature of the digital circuit is less than the boost temperature.

25 Claims, 4 Drawing Sheets

(56) References Cited

U.S. PATENT DOCUMENTS

| | | | |
|---|---|---|---|
| 2015/0153754 A1* | 6/2015 | Klosters | G05F 1/66 327/143 |
| 2017/0025949 A1* | 1/2017 | Joshi | H02M 3/158 |
| 2019/0041923 A1* | 2/2019 | Atsatt | H03K 19/0008 |

* cited by examiner

INTEGRATED CIRCUIT WITH ENHANCED OPERATION OVER OPERATING RANGES UTILIZING A PROCESS SIGNAL TO FINE TUNE A VOLTAGE BOOSTING OPERATION

FIELD

The present disclosure relates generally to integrated circuits, and more particularly to CMOS digital integrated circuits that operate using clock signals.

BACKGROUND

Modern digital electronic circuits use clock signals to time inputs and outputs. As integrated circuit manufacturing technology has advanced, circuits are able to operate at faster speeds and at lower power supply voltages. For example, modern complementary metal-oxide-semiconductor (CMOS) technology can be used to construct digital logic circuits that can operate using clock speeds well above 1 gigahertz (GHz) and power supply voltages of approximately 1.0 volts or less. These advances have led to better performance and longer battery life.

Circuit designers create netlists of circuits of the integrated circuit chips, and input the netlists to a router tool that automatically lays out the transistors on the chip. Circuit simulation tools check the operation of the laid-out circuits over the specified operating ranges, usually referred to as the process, voltage, and temperature (PVT) window. For example, the integrated circuit may be required to operate at any temperature between −40° C. to +125° C., at any voltage within a range around the nominal power supply voltage $V_{DDNOM}$, e.g. $V_{DDNOM} \pm 10\%$, and as various manufacturing process parameters that change the speed of operation vary within certain specified ranges. The chips are generally simulated at the endpoints of the ranges, and each unique combination of endpoints is known as a "corner". If the chips are operational at all corners, the designer assumes they are likewise operational at all intermediate points, which simplifies the simulation.

To meet internal setup times, chips need to be fast, but to meet internal hold times, the chips cannot be too fast. Being either too fast or too slow will result in device failure. Among the most important process determinants of a CMOS chip's speed are generally the threshold voltages of P- and N-channel transistors. If the P- and N-channel threshold voltages are at their lowest allowed voltages, temperature is at its lowest allowed temperature, and power supply voltage is at its highest voltage, then the chip is usually considered to be in a the "best case speed" corner. If the P- and N-channel threshold voltages are at their highest allowed voltages, the temperature is at its highest allowed temperature, and the power supply voltages at its lowest voltage, the chip is usually considered to be in a "worst case speed" corner.

If the simulation fails at any point in the design window, then the layout is adjusted by, for example, moving certain circuits closer together, changing the detailed logic gates implementing the function, or splitting the logic function by inserting mode flip-flops, and then the circuit designer re-simulates the operation. This process is known as timing closure. After timing closure has been met, the devices are ready for manufacture. After manufacture, and the circuit designer checks the integrity of the simulation on actual integrated circuit chips at all the PVT corners, a process known as characterization.

Circuit designers are now able design complex integrated circuit chips that may contain many hundreds of thousands or millions of transistors. Simulation, timing closure, and characterization of these very large chip designs are time consuming processes, especially when they are simulated or characterized at all PVT corners. Thus, there is a continual difficulty even with modern routing tools in designing circuitry and laying it out on chips so that the chips are operational at all PVT corners.

Figure 1:
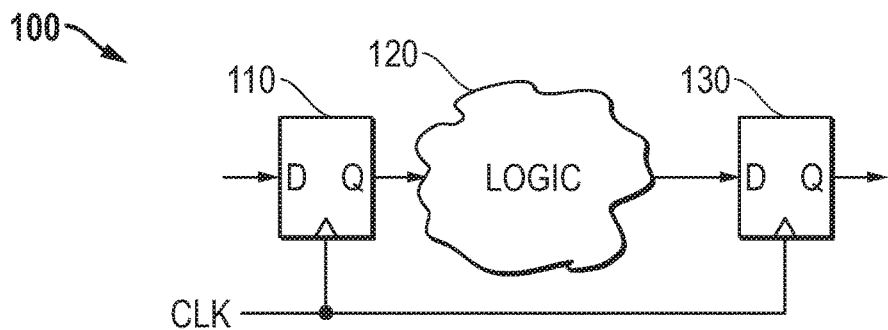
FIG. 1 illustrates in block diagram form a clocked digital logic system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

FIG. 1 illustrates in block diagram form a clocked digital logic system 100 known in the prior art. Clocked digital logic system 100 includes a flip-flop 110, a logic block 120, and a flip-flop 130. Flip-flop 110 is a clocked D flip-flop having a D input for receiving an input of clocked digital logic system 100, a clock input for receiving a clock signal labeled "CLK", and a Q output. Logic block 120 has an input connected to the output of flip-flop 110, and an output. Flip-flop 130 is a clocked D flip-flop having a D input connected to the output of logic block 120, a clock input for receiving the CLK signal, and an output for providing the output of clocked digital logic system 100.

Clocked digital logic system 100 performs any of a variety of operations of digital electronic systems, such as a processing pipeline stage in a data processor. Logic block 120 performs a combinatorial and/or sequential logic function. The speed at which logic block 120 must perform its operation is bounded by the clocking of flip-flops 110 and 120 its input and output and must be completed within a single CLK cycle. The D input to flip-flop 110 is latched on an edge of the CLK signal, e.g. the rising edge. The prior logic circuit provides the input to flip-flop 110 in a stable state a setup time before the rising edge of the clock signal, and keeps it stable after the rising edge of the clock signal for a hold time. Similarly, logic block 120 has to provide the input to flip-flop 130 in a stable state a setup time before the rising edge of the clock signal, and keep it stable after the rising edge of the clock signal for a hold time. If logic block 120 is too fast, it will fail to meet the hold time of the prior result at its output after the rising edge of the prior CLK signal at the D of flip-flop 130. If logic block 120 is too slow, it will fail to meet the setup time of the next result at its output before the rising edge of the current CLK signal at the D input of flip-flop 130. Clocking may consist of rising and/or falling edges, and use half cycles.

Moreover, the integrated circuit in which clocked digital logic system 100 resides is expected to operate correctly over variations in process, voltage, and temperature (PVT). First, the manufacturing process causes logic circuits to be relatively fast or relatively slow. Manufacturing process parameters that are relevant to speed in a CMOS manufacturing process primarily include threshold voltages of P-type and N-type transistors, but can also include sheet resistivity of doped polysilicon, etch time affecting the sizes of transistor gates, and the like. Second, power supply voltage variation causes the integrated circuit to be fast or slow. For example, the power supply voltage may be specified over a range of ±10% of its nominal amount. Third, the temperature of the integrated circuit may vary over a large range depending on the environment they are expected to be used in. For example, an automotive microcontroller (MCU) may be expected to operate over an extended temperature range of from −40° C. to 125° C. The "fast corner" has traditionally been regarded as low P- and N-channel transistor thresholds, high power supply voltage, and low temperature, whereas the "slow corner" has traditionally been regarded as high P- and N-channel transistor thresholds, low power supply voltage, and high temperature. These large allowed variations in operational parameters have made it difficult for designers to ensure proper operation of the integrated circuit across all expected variations in PVT.

Figure 2:
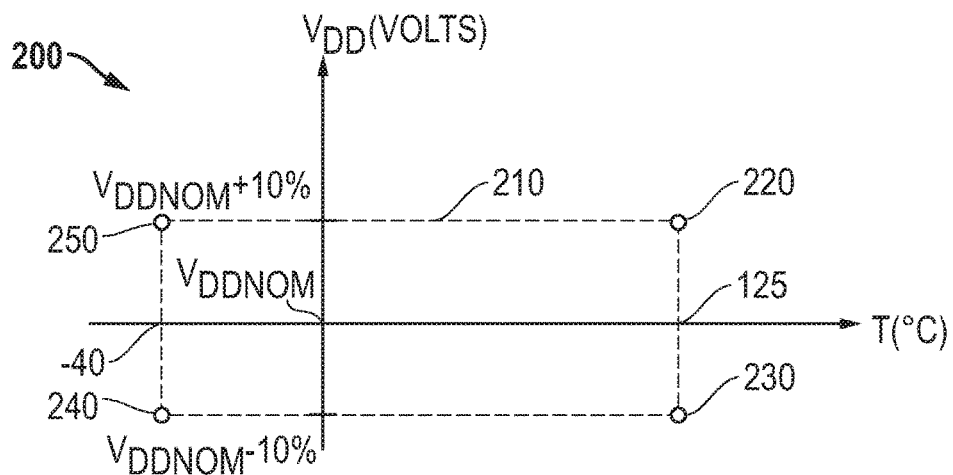
FIG. 2 illustrates a graph of an operation window of the clocked digital logic system of FIG. 1.

FIG. 2 illustrates a graph of an operation window of the clocked digital logic system of FIG. 1. In FIG. 2, the horizontal axis represented temperature in ° C., and the vertical axis represents power supply voltage designated "$V_{DD}$" in volts. In the example shown in FIG. 2, the expected variation in temperature extends from −40° C. to +125° C., and the expected variation in power supply voltage extends from the nominal voltage $V_{DDNOM}$−10% to $V_{DDNOM}$+10%. These variations create a design window 210 that will be used by the circuit designer to simulate the operation of the design prior to completing the design, and to characterize the design after manufacture. Design window 210 includes four corners, including a corner 220 in which $V_{DD}=V_{DDNOM}$+10% and T=+125° C.; a corner 230 in which $V_{DD}=V_{DDNOM}$−10% and T=+125° C.; a corner 240 in which $V_{DD}=V_{DDNOM}$−10% and T=−40° C.; and a corner 250 in which $V_{DD}=V_{DDNOM}$+10% and T=−40° C. To simulate the operation, the circuit designer simulates the operation at each of the four corners and if the design operates properly at all four corners, then the design is considered to be verified.

Graph 200 does not illustrate variations in manufacturing process. The addition of manufacturing process would add a third dimension, i.e. a z-axis, to graph 200. If the process parameters were combined into a composite measurement, for example, the z-axis would extend from "slow" to "fast" along the z-axis, and the design would contain eight corners. The circuit designer would need to ensure that the integrated circuit works properly at all eight corners of the three-dimensional (3D) window. The simulation could be further expanded to account for variations in individual process parameters by adding additional dimensions to the 3D design window. With each new process parameter that is individually considered, the number of corners and the complexity of the simulation increases by a factor of two, and at some point the simulation would become impractical.

Testing the integrated circuit at all process corners assumes that the operation will be monotonic along each allowed range, i.e. uniformly faster as the PVT moves from the worst-case speed corner to the best-case speed corner. The inventors have discovered that the long-held assumption of monotonicity of operation with variations in PVT breaks down in some circumstances. This breakdown will now be explained.

Figure 3:
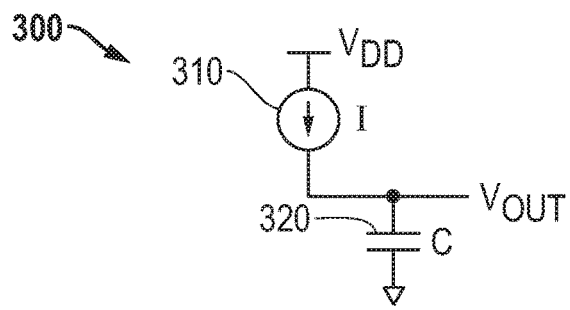
FIG. 3 illustrates in schematic form a circuit that can be used to model a switching operation in a complementary metal-oxide-semiconductor (CMOS) digital circuit.

FIG. 3 illustrates in schematic form a circuit 300 that can be used to model a switching operation in a CMOS digital circuit. Circuit 300 includes a current source 310 and a capacitor 320. Current source 310 has a first terminal connected to $V_{DD}$, and a second terminal for providing an output labeled "$V_{OUT}$". Capacitor 320 has a first terminal connected to the second terminal of current source 310, and a second terminal connected to ground.

Circuit 300 models the switching of a P-channel MOS transistor to drive an input node of a subsequent digital logic circuit from a voltage representative of a logic low to a voltage representative of a logic high. $V_{OUT}$ rises as the current provided by current source 310 charges capacitor 320 from its previous logic low level to a level that would be recognized as a logic high by the subsequent stage. A current I flows through a P-channel transistor that has been made conductive, and is given by the following formula:

$$I = \mu(T)C_{OX}\frac{W}{L}(V - V_{TH}(T)) \quad [1]$$

in which $\mu(T)$ is the mobility of the majority carriers (holes in this case) as a function of temperature, $C_{OX}$ is the oxide capacitance, W is the gate width, L is the gate length, and $V_{TH}(T)$ is the threshold voltage of the transistor as a function of temperature T. $C_{OX}$, W, and L are determined by manufacturing. $\mu(T)$ is proportional to $1/T^{3/2}$, so when temperature rises, $\mu(T)$ decreases, tending to decrease I and making the circuit operate more slowly. This decrease in mobility with increasing temperature has been the basis for the widely held assumption that CMOS circuits slow down with increasing temperature, and speed up with decreasing temperature.

$V_{TH}$ is also a function of temperature, and can be estimated by the equation:

$$V_{TH}(T) \approx V_{TH25} - k(T-25) \quad [2]$$

in which $V_{TH25}$ is the threshold voltage of the transistor at 25° C., and k is a constant and is equal to about 2 millivolts (mV) per degree Celsius. At 25° C., $V_{TH}(T) \approx V_{TH25} - k(T-25) = V_{TH25} - k(25-25) = V_{TH25}$. Equation [2] shows that $V_{TH}$ decreases linearly with increases in T. Thus, the term $(V - V_{TH}(T))$ tends to increase current I linearly with increasing T. Since $\mu(T)$ is proportional to $1/T^{3/2}$, however, current I generally tends to decrease as T increases and increase as T decreases.

However, modern integrated circuits can have a relatively high V compared to $V_{TH}$. For example, $V_{DD}$ can be around 2.0 V with $V_{TH25}=0.6$ V. The (V $V_{TH}(T)$) term has historically been large enough so that I still rises monotonically across the entire temperature range. However, with relatively small power supply voltages compared to threshold voltages, such as $V_{DD}=1.0$ V with $V_{TH25}=0.6$ V, current I will start to fall as T decreases even though $\mu(T)$ continues to increase.

To provide more stable operation over PVT, the inventors have designed an integrated circuit that boosts power supply voltage $V_{DD}$ at colder temperatures. This boost enhances the ability of a given integrated circuit design to operate properly across PVT, or to meet timing closure during design across the entire design window.

As will be shown below, the voltage boost creates new design corners that must be characterized and simulated. The corners need to be simulated during design and characterized after fabrication to ensure that the simulation is accurate. By raising the power supply voltage at cold temperatures, dynamic power will increase, but leakage is lower, allowing a greater budget for dynamic power dissipation at the higher power supply voltage. Moreover, most use cases are at higher temperatures than the temperature at which the power supply voltage is boosted.

An integrated circuit capable of implementing voltage boosting below a target temperature will now be described.

Figure 4:
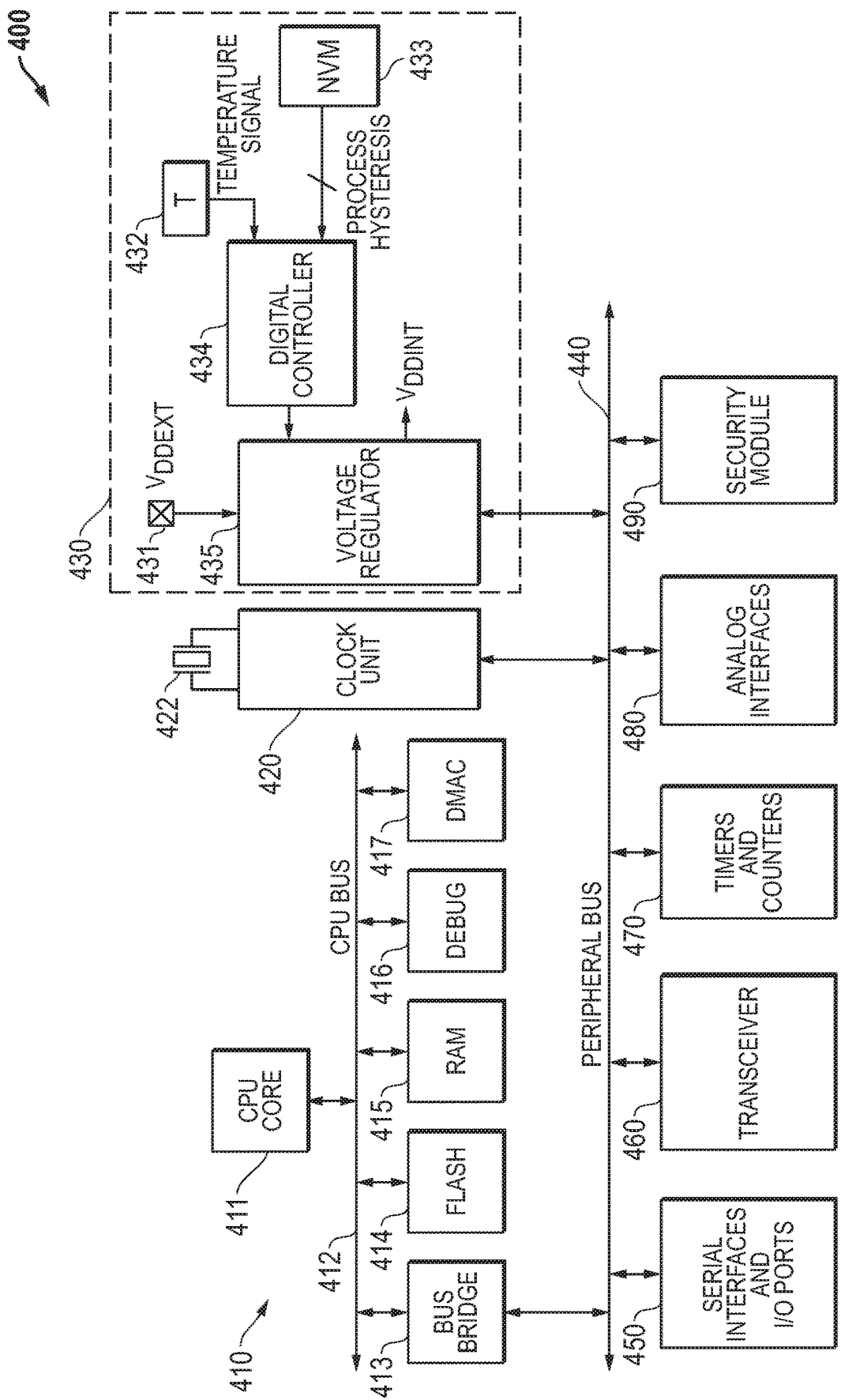
FIG. 4 illustrates in partial block diagram and partial schematic form a microcontroller unit (MCU) according to an embodiment of the present disclosure.

FIG. 4 illustrates in partial block diagram and partial schematic form a microcontroller unit (MCU) 400 according to an embodiment of the present disclosure. MCU 400 includes generally a central processing unit (CPU) system 410, clock unit 420, an energy management circuit 430, a peripheral bus 440, a set of serial interfaces and input/output (I/O) ports 450, a transceiver 460, a set of timers and counters 470, a set of analog interfaces 480, and a security module 490.

CPU system 410 includes a CPU bus 412 interconnecting a CPU core 411, a bus bridge 413, a FLASH memory 414, a random-access memory (RAM) 415, a debug circuit 416, and a direct memory access (DMA) controller (DMAC) 417. CPU system 410 includes a CPU bus 412 separate from peripheral bus 440 to isolate transactions initiated by CPU core 411 to local devices and memory without affecting traffic on peripheral bus 440. Bus bridge 413 is a circuit that allows cross-bus transfers between CPU bus 412 and peripheral bus 440. CPU system 410 provides FLASH memory 414 for non-volatile storage of program code that can be bootstrap loaded from an external source, as well as parameters that need to be preserved when MCU 400 is powered down. RAM 415 provides a working memory for use by CPU core 411. Debug circuit 416 provides program trace capabilities with access to registers on CPU core 411 for software debug. DMAC 417 provides programmable DMA channels to offload CPU core 411 from routine data movement tasks between peripherals and memory.

In addition, MCU 400 includes a clock unit 420 with a variety of clocks and clock functions that MCU 400 uses to support its low power modes. For example, clock unit 420 can include high frequency oscillators based on crystal references, as well as lower precision fully integrated resistor-capacitor (RC) oscillators and very low speed RC oscillators that allow standby and keep-alive operations. Shown in FIG. 4 is a crystal resonator 422 that can be used with a crystal oscillator circuit in clock unit 420.

Energy management circuit 430 includes an external terminal 431, a temperature sensor 432, a non-volatile memory (NVM) 433, a digital controller 434, and a voltage regulator 435. External terminal 431 receives an external power supply voltage labeled "$V_{DDEXT}$". Temperature sensor 432 has an output for providing a signal labeled "TEMPERATURE SIGNAL". Non-volatile memory 433 has an output for providing signals labeled "PROCESS" and "HYSTERESIS". Digital controller 434 has a first input connected to the output of temperature sensor 432, a second input connected to the output of NVM 433, and an output. Voltage regulator 435 has a first input connected to external terminal 431, a second input connected to the output of digital controller 434, and an output for providing a power supply voltage labeled "$V_{DDINT}$" to various digital circuits on MCU 400.

Peripheral bus 440 interconnects bus bridge 413, clock unit 420, energy management circuit 430, serial interfaces and I/O ports 450, transceiver 460, timers and counters 470, analog interfaces 480, and security module 490.

The serial interfaces in serial interfaces and I/O ports 450 operate according to a variety of synchronous and asynchronous character-oriented and serial protocols, and the I/O ports are a set of general-purpose input/output circuits and terminals that can be programmed for specific functions or remain available to software for general purpose operation. Transceiver 460 includes a transmitter and a receiver that perform various analog and digital communication functions on chip. Timers and counters 470 provide various programmable timing and event counting functions useful for embedded control, and include a watchdog timer and a real time clock. Analog interfaces 480 include an analog comparator and analog-to-digital converter (ADC) for accurate analog input signal measurement. Security module 490 provides an encryption function that is useful for data communication and storage in secure environments.

Generally, MCU 400 integrates CPU system 410 and several peripherals for a wide variety of application environments and is suitable for very low power operation. Energy management circuit 430 regulates the externally provided voltage $V_{DDEXT}$ to provide an internal voltage $V_{DDINT}$. Energy management circuit 430 boosts $V_{DDINT}$ at a certain low temperature known as the boost temperature to compensate for the low-temperature slowdown of low-voltage CMOS ICs. This power supply voltage boosting allows the integrated circuit to operate properly at a wider voltage and temperature range, although it creates more design corners that need to be simulated and characterized. Accordingly, energy management circuit 430 has a temperature sensor 432 to provide a temperature signal, and digital controller 434 compares that temperature to a threshold. Energy management circuit 430 also has two features that allow the boosting to be fine-tuned.

First, NVM 433 provides the PROCESS signal to indicate the values of various process parameters, and digital controller 434 uses these values to fine tune the temperature threshold at which to implement voltage boosting. For example, if the PROCESS signal indicates the integrated circuit chip has been manufactured at a slow corner of the design window, then digital controller 434 will raise the temperature at which voltage boosting occurs to compensate for the slow processing. The PROCESS signal can be set in a variety of ways. For example, the speed of the integrated circuit chip can be directly measured through functional testing at manufacturing final test, and the PROCESS signal can be set in NVM 433 according to the measured speed. The speed of the integrated circuit chip can also be estimated based on process control parameters that were measured on the silicon wafer that integrated circuit chip came from. This technique is simple because it uses parameters that have already been measured, but does not take into account process variations across the wafer. Moreover, the process speed measurement can be determined for the specific chip by on-chip measurement devices. NVM 433 can be implemented in a variety of ways, for example by electrical or laser fuses, one-time programmable floating-gate memory cells, normal electrically erasable floating gate memory cells, and the like Second, digital controller uses the HYSTERESIS to determine the amount of hysteresis guardband over which the voltage boosting is implemented or canceled. As will be explained below, the guardband affects the values of the corners of the design window that need to be simulated and characterized.

The effect of voltage boosting at cold temperatures on simulation, timing closure, and characterization will now be explored with reference to a concrete example.

Figure 5:
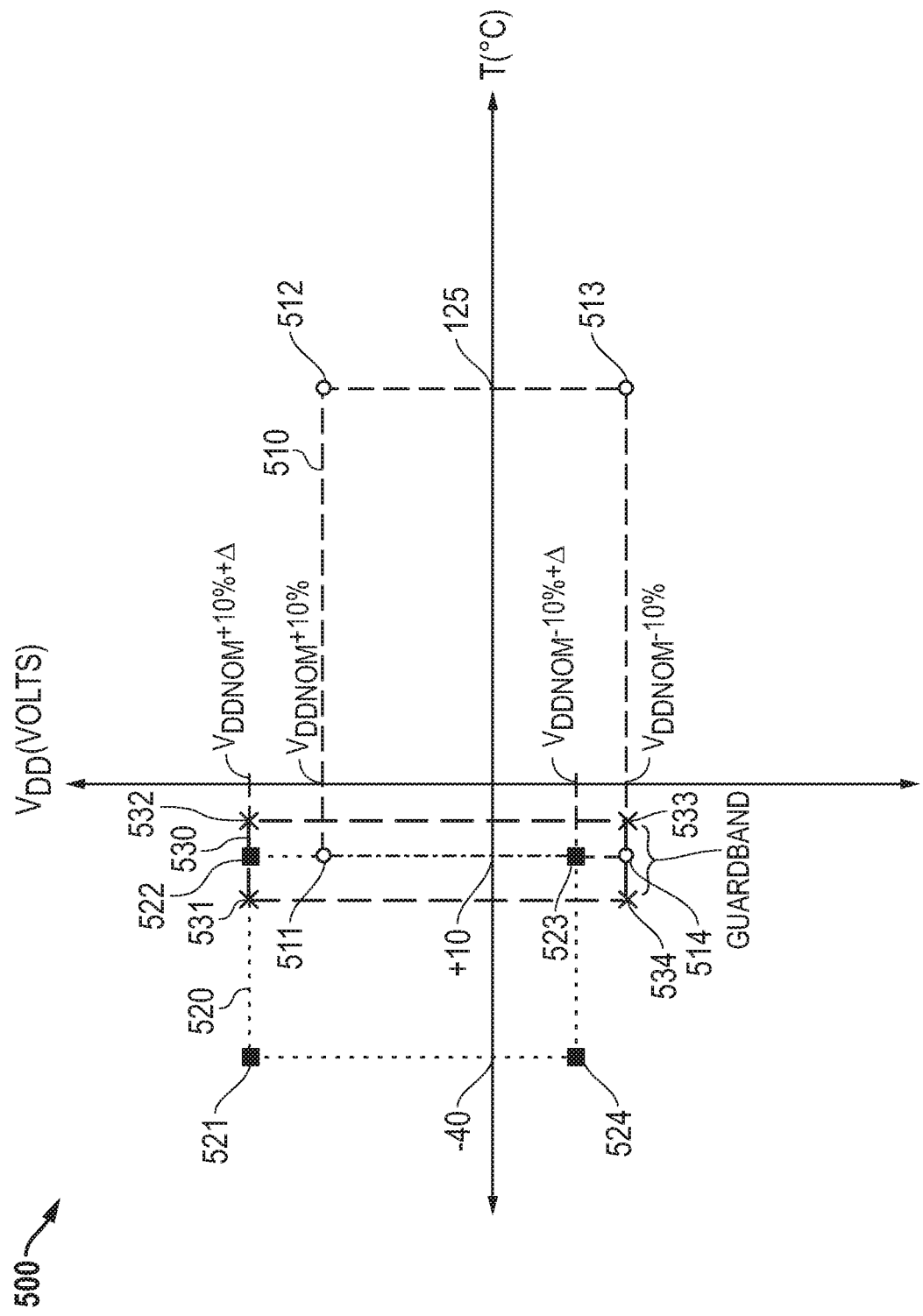
FIG. 5 illustrates a graph of the operation of the MCU of FIG. 4 over an expected voltage and temperature window.

FIG. 5 illustrates a graph 500 of the operation of MCU 400 of FIG. 4 over an expected voltage and temperature window. In graph 500, the horizontal axis represents temperature T in degrees Celsius (° C.), and the vertical axis represents power supply voltage $V_{DD}$ in volts. In this example, MCU 400 must operate properly over a specified temperature range from −40° C. to +125° C. and over a voltage range covering a nominal voltage (e.g. 1.2 volts) ±10%. As shown above with respect to FIG. 2, such a voltage and temperature range defines a design window 510. Design window 510 includes four corners, including a corner 511; a corner 512 in which $V_{DD}=V_{DDNOM}+10\%$ and T=+125° C.; a corner 513 in which $V_{DD}=V_{DDNOM}-10\%$ and T=+125° C.; and a corner 514.

However as mentioned above, the inventors have discovered that in low-voltage CMOS processes, the speed of operation starts to decrease below +25° C. In order to ensure proper operation at lower voltages, the inventors have implemented a voltage boost for low temperatures. In the example shown in FIG. 5, power supply voltage $V_{DD}$ is boosted for temperatures in the operating range below +10° C., namely from −40° C. to +10° C., to compensate for the reduction in speed, thus reducing the criticality of low temperatures. In order to increase the power supply voltage by a given amount Δ, the design has to operate over a ranger of from $(V_{DDNOM}+10\%+\Delta)$ to $(V_{DDNOM}-10\%+\Delta)$. In the illustrated example, the value Δ is about 5% of $V_{DDNOM}$.

The low temperature voltage boost creates a new, offset design window 520 that also has four corners, including a corner 521 in which T=−40° C. and $V_{DD}=V_{DDNOM}+10\%+\Delta$, a corner 522 in which T=+10° C. and $V_{DD}=V_{DDNOM}+10\%+\Delta$, a corner 523 in which $V_{DD}=V_{DDNOM}+10\%+\Delta$, and a corner 524 in which $V_{DD}=V_{DDNOM}-10\%+\Delta$ and T=−40° C.

To simulate the operation over the modified design window, a circuit designer generally needs to simulates the operation at each of the four corners of each of design window 510 and design window 520, and if the design operates properly at all four corners, then the design is considered to be verified. However, the determination of whether the temperature is above or below the boost temperature is itself subject to uncertainty due to variations of the operation of components from their nominal values when the amount of hysteresis is variable. This amount is guard-banded by providing an additional box of uncertainty 530 around the nominal boost temperature as shown in graph 500. This zone of uncertainty along the temperature axis creates four new corners 531, 532, 533, and 534. As shown in FIG. 5, corners 531 and 533 are encompassed by design window 520 and 510, respectively, whereas corners 532 and 534 represent new corners in the design window. Thus, the six corners that will be simulated and characterized for proper operation are corners 521, 532, 512, 513, 534, and 524.

While FIG. 5 shows the additional simulation and characterization points in consideration of voltage and temperature limits, it did not account for variation in process parameters. The effect of changes in process parameters will now be described.

Figure 6:
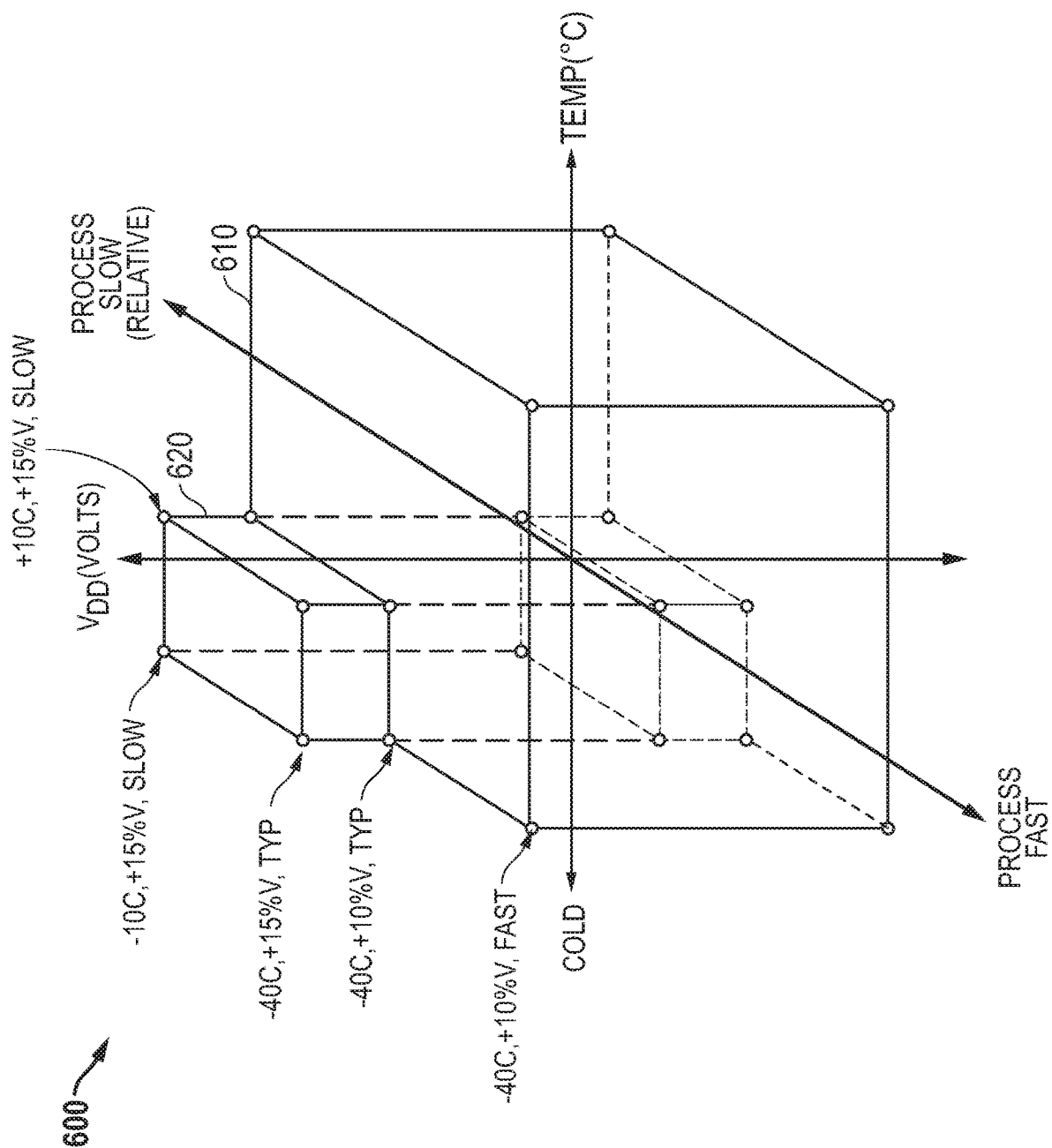
FIG. 6 illustrates a graph of an operation of the MCU of FIG. 4 over an expected process, voltage, and temperature (PVT) window.

FIG. 6 illustrates a graph 600 of an operation of MCU 400 of FIG. 4 over an expected process, voltage, and temperature (PVT) window. In graph 600, the horizontal axis represents temperature T in degrees Celsius (° C.), the vertical axis represents power supply voltage $V_{DD}$ in volt, and the z-axis represents variations in process that affect device speed on a relative scale, in which the far dimension from the origin represents slower processing, and the near dimension from the origin represents faster processing.

Points along the process or z-axis can be determined by combining and weighting various processing parameters that contribute to slower or faster speed, such as threshold voltages of P-type and N-type transistors, sheet resistivity of doped polysilicon, etch time leading to sizes of transistor gates, and the like. During integrated circuit fabrication, these processing variables are typically measured on the silicon wafer for process control purposes but are known and available to program into NVM 433. In addition, each integrated circuit die on the wafer can have on-chip process measurement structures that can be individually measured and then programmed into NVM 433. In yet another implementation, speed can be measured at a precise temperature and voltage using functional testing on an integrated circuit tester, such as at final test.

Graph 600 includes a 3-dimensional or solid design window 610 having eight corners representing the extents in the process, voltage, and temperature dimensions defining the normal design window. Unlike graph 500, however, graph 600 takes into consideration process, voltage, and temperature to determine when to boost the power supply voltage. The decision to boost occurs generally at low temperature and relatively slow processing and defines another 3D or solid design window 620 offset from design window 610 along the voltage axis. As before, boosting compensates for process and temperature variations that tend to slow down the operation, but creates new corners that will be simulated and characterized.

In further analysis, the design window can be extended beyond three dimensions by deconstructing the single process measurement into more specific measurements, creating a hyper-dimensional surface that has even more corners. The technique would expand correspondingly. Moreover, a temperature guard-band can be added to the 3D model, adding further design corners to be simulated and characterized. However in many systems, a 3D analysis that uses a composite process index may indeed be sufficient.

Thus, in one form an integrated circuit having a digital circuit and an energy management circuit has been described. The digital circuit operates with an internal power supply voltage in synchronism with a clock signal and includes complementary metal-oxide-semiconductor (CMOS) transistors. The energy management circuit has an input for receiving an external power supply voltage and an output for providing the internal power supply voltage. The energy management circuit is thermally coupled to the digital circuit and sets the internal power supply voltage to a nominal voltage when a temperature of the digital circuit is greater than a boost temperature. The energy management circuit also boosts the internal power supply voltage to a boosted voltage greater than the nominal voltage when the temperature of the digital circuit is less than the boost temperature.

The above-disclosed subject matter is to be considered illustrative, and not restrictive, and the appended claims are intended to cover all such modifications, enhancements, and other embodiments that fall within the true scope of the claims. For example, the boost temperature and the boost amount will vary in different embodiments. Different ways of adjusting boost temperature according to process parameters are also contemplated, including forming a composite measurement of relative speed caused by process variations, measuring specific process parameters such as P- and N-channel threshold voltages, sheet resistivity of doped polysilicon, etch time leading to sizes of transistor gates, and the like. This technique can be used in a variety of integrated circuit types, such as MCUs, other data processors, application specific integrated circuits (ASICs), field programmable gate arrays (FPGAs), mixed signal chips, and the like.

Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit, comprising:
   a digital circuit operating with an internal power supply voltage in synchronism with a clock signal and comprising complementary metal-oxide-semiconductor (CMOS) transistors; and
   an energy management circuit having an input for receiving an external power supply voltage and an output for providing said internal power supply voltage, wherein said energy management circuit is thermally coupled to said digital circuit and sets said internal power supply voltage to a nominal voltage when a temperature of said digital circuit is greater than a boost temperature, and boosts said internal power supply voltage to a boosted voltage greater than said nominal voltage when said temperature of said digital circuit is less than said boost temperature selectively in response to a process signal, wherein said process signal is indicative of at least one process parameter of said digital circuit.

2. The integrated circuit of claim 1, wherein said energy management circuit comprises:
   an integrated circuit terminal for receiving said external power supply voltage;
   a temperature sensor thermally coupled to said digital circuit having an output for providing a temperature signal indicative of said temperature;
   a digital controller having a first input coupled to said temperature sensor, and an output; and
   a voltage regulator having an input coupled to said integrated circuit terminal, a control input coupled to said output of said digital controller, and an output for providing said internal power supply voltage.

3. The integrated circuit of claim 2, wherein said energy management circuit further comprises:
   a non-volatile memory having an output for providing said process signal,
   wherein said digital controller further has a second input coupled to said output of said non-volatile memory and varies said boost temperature in response to said process signal.

4. The integrated circuit of claim 2, wherein said energy management circuit further comprises:
   a non-volatile memory having an output for providing said process signal,
   wherein said digital controller further has a second input coupled to said output of said non-volatile memory and varies said boosted voltage in response to said process signal.

5. The integrated circuit of claim 2, wherein said energy management circuit further comprises:
   a non-volatile memory having an output for providing a hysteresis signal,
   wherein said digital controller further has a second input coupled to said output of said non-volatile memory and determines a hysteresis amount of setting and boosting said internal power supply voltage in response to said hysteresis signal.

6. The integrated circuit of claim 2, wherein the integrated circuit is a microcontroller unit (MCU), and said digital circuit comprises a central processing unit (CPU) core.

7. The integrated circuit of claim 1, wherein the integrated circuit is adapted to operate between a low temperature and a high temperature, and said boost temperature is between said low temperature and said high temperature.

8. The integrated circuit of claim 7, wherein said low temperature is equal to −40° C., and said high temperature is equal to +125° C.

9. The integrated circuit of claim 7, wherein said boost temperature is approximately equal to +10° C.

10. The integrated circuit of claim 1, wherein said boosted voltage is equal to said nominal voltage plus approximately five percent of said nominal voltage.

11. A circuit adapted to operate between a low temperature and a high temperature, comprising:
    a digital circuit operating with an internal power supply voltage in synchronism with a clock signal;
    a voltage regulator having an input for receiving an external power supply voltage, a control input, and an output for providing said internal power supply voltage at a level determined by said control input;
    a temperature sensor thermally coupled to said digital circuit and having an output for providing a temperature signal, wherein said temperature signal is representative of a temperature of said digital circuit; and
    a digital controller having a first input coupled to said temperature sensor, a second input for receiving a process signal, wherein said process signal is indicative of at least one process parameter of said digital circuit, and an output coupled to said control input of said voltage regulator, wherein said digital controller controls said voltage regulator selectively in response to said process signal to set said internal power supply voltage at a nominal voltage when said temperature signal indicates said temperature is above a boost temperature between said low temperature and said high temperature, and at a boosted voltage when said temperature signal indicates said temperature is below said boost temperature, wherein said boosted voltage is greater than said nominal voltage.

12. The circuit of claim 11, wherein said low temperature is equal to −40° C., and said high temperature is equal to +125° C.

13. The circuit of claim 11, wherein said boost temperature is approximately equal to +10° C.

14. The circuit of claim 11, wherein said boosted voltage is equal to said nominal voltage plus approximately five percent of said nominal voltage.

15. The circuit of claim 11, wherein said digital circuit is implemented using complementary metal-oxide-semiconductor (CMOS) transistors.

16. The circuit of claim 11, further comprising:
    a non-volatile memory having an output for providing said process signal,
    wherein said digital controller is further responsive to said process signal to vary said boost temperature in response to said process signal.

17. The circuit of claim 11, further comprising:
a non-volatile memory having an output for providing said process signal,
wherein said digital controller is further responsive to said process signal to vary at least one of said nominal voltage and said boosted voltage in response to said process signal.

18. The circuit of claim 11, further comprising:
a non-volatile memory having an output for providing a hysteresis signal,
wherein said digital controller further has a second input coupled to said output of said non-volatile memory and determines a hysteresis amount of setting and boosting said internal power supply voltage in response to said hysteresis signal.

19. A method for operating a digital circuit across expected process, voltage, and temperature (PVT) variations, comprising:
receiving an external power supply voltage;
converting said external power supply voltage to an internal power supply voltage; and
operating the digital circuit using said internal power supply voltage,
wherein said converting comprises:
measuring a temperature of the digital circuit;
if said temperature exceeds a boost temperature, setting said internal power supply voltage to a nominal voltage;
if said temperature is less than said boost temperature, boosting said internal power supply voltage to a boosted voltage greater than said nominal voltage; and
performing said setting and said boosting selectively in response to a process signal, wherein said process signal is indicative of at least one process parameter of said digital circuit.

20. The method of claim 19, wherein an expected temperature variation is from −40° C. to +125° C., and said boost temperature is approximately equal to +10° C.

21. The method of claim 19, wherein said boosted voltage is equal to said nominal voltage plus approximately five percent of said nominal voltage.

22. The method of claim 19, wherein the digital circuit comprises complementary metal-oxide-semiconductor (CMOS) transistors.

23. The method of claim 19, further comprising:
storing said process signal in a non-volatile memory; and
varying said boost temperature in response to said process signal.

24. The method of claim 19, further comprising:
storing said process signal in a non-volatile memory; and
varying said boosted voltage in response to said process signal.

25. The method of claim 19, further comprising:
storing a hysteresis signal in a non-volatile memory, wherein said hysteresis signal is indicative of a desired hysteresis; and
varying a hysteresis of said setting and said boosting in response to said hysteresis signal.

* * * * *